US006259149B1

(12) United States Patent
Burkhardt et al.

(10) Patent No.: US 6,259,149 B1
(45) Date of Patent: Jul. 10, 2001

(54) FULLY ISOLATED THIN-FILM TRENCH CAPACITOR

(75) Inventors: Joseph J. Burkhardt, Minneapolis; Jeremy A. Schweigert, Eagan; Daniel J. Fertig, Edina, all of MN (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/243,047

(22) Filed: Feb. 3, 1999

Related U.S. Application Data

(60) Provisional application No. 60/091,896, filed on Jul. 7, 1998.

(51) Int. Cl.[7] .................................................. H01L 29/00
(52) U.S. Cl. ........................ 257/534; 257/307; 257/535
(58) Field of Search ................................ 257/301, 302, 257/303, 304, 305, 306, 307, 68, 516, 528, 532, 533, 534, 535

(56) References Cited

U.S. PATENT DOCUMENTS 4,409,608 * 10/1983 Yoder ...................................... 257/534
4,954,927 * 9/1990 Park ........................................ 361/328
5,354,701 * 10/1994 Chao ...................................... 438/244

* cited by examiner

Primary Examiner—Stephen D. Meier
Assistant Examiner—Jeff Vockrodt
(74) Attorney, Agent, or Firm—Kinney & Lange, P.A.

(57) ABSTRACT

A process for forming an isolated thin-film trench capacitor includes forming a first trench in a substrate and filling it with an electrically insulating material. A trench capacitor is formed in the first trench by forming first and second pluralities of conductive plates, such as polycrystalline silicon, separated by a layer of dielectric material. The first plurality of conductive plates are electrically connected together and the second plurality of conductive plates are electrically connected together. The dielectric material isolates the trench capacitor from the remainder of the chip. In one form, the trench capacitor comprises a plurality of second trenches in the electrically insulating material and the plurality of conductive plates are formed in the second trenches. In another form, a second trench is formed in the electrically insulating material and the trench capacitor is formed by interleaving conductive layers separated by dielectric material in the second trench.

8 Claims, 3 Drawing Sheets

FULLY ISOLATED THIN-FILM TRENCH CAPACITOR

CROSS-REFERENCE TO RELATED APPLICATION(S)

This application claims benefit of Provisional Application No. 60/091,896 filed Jul. 7, 1998 for "Fully-Isolated Thin-Film Trench Capacitor" by Joseph J. Burkhardt, Jeremy Schweigert and Daniel J. Fertig.

BACKGROUND OF THE INVENTION

This invention relates to trench capacitors, and particularly to a process for forming a fully isolated thin-film trench capacitor and trench capacitors made thereby.

Custom analog integrated circuits require use of capacitors for AC coupling, noise bypassing, supply filtering, etc. While discrete capacitors have been used for such purposes, there has been increased interest in integrating these capacitors onto chips with other circuitry. Integration of capacitors onto chips is commonly performed for DRAM cells where capacitors and MOSFET devices form bit cells for storing data. There are several advantages associated with the inclusion of capacitors on chips, including reduced parasitic inductance, and simpler assembly at the circuit board level. However, some analog functions require the integration of a few (10 to 20) capacitors in the hundreds'picofarad range, resulting in 2 or 3 nanofarads of capacitance for each chip, whereas a 1 gigabit DRAM chip will contain about $10^9$ capacitors each having about 35 femtofarads, resulting in about 35 microfarads of capacitance per chip. While the total capacitance of the DRAM chip may be greater than the analog chip, the capacitance of individual capacitors on the analog chip is greater than on the DRAM chip.

Stray (parasitic) capacitance is a factor in the successful operation of electronic chips. Total chip capacitance and individual capacitance on the chip are independent factors affecting parasitic capacitance on a chip. Also, operating voltages of the chip, dielectric materials, chip layout and geometry, and chip processing are all factors affecting parasitic capacitances in the chip and the operation of the chip.

There are three basic families of on-chip capacitors: planar, stack, and trench. A planar capacitor is one in which the plates and dielectric material are positioned in single planes to form a generally two-dimensional, planar capacitor on a surface of the chip. Planar capacitors ordinarily take up a considerable amount of real estate on a chip, and suffer from limitations in terms of capacitance density, linearity and parasitic capacitance. Stack and trench capacitors are more threedimensional in shape, either interleaving the capacitive plates to form a stack of interleaved plates, or extending the capacitive plates in directions both normal and parallel to the plane of the chip, or both. Stack capacitors extend above the topography of the chip, and are usually constructed in the later stages of fabrication of the chip. Trench capacitors, on the other hand, extend into the chip and below the circuitry of the chip, thereby resulting in a planar topography of the chip. Both stack and trench capacitors offer the advantage of increased capacitance density. However, the choices for dielectric material are more limited in trench capacitors than in stack capacitors because the trench capacitor is usually fabricated early in the fabrication process and the dielectric material must be reasonably thermally stable to withstand subsequent chip fabrication processing. Thus, stack capacitors offer the advantage of a wider choice of dielectric material because they are fabricated late in the process. While stack capacitors offer a greater range of materials in fabrication, they are more severely limited in placement on the chip, and the raised topography of stack capacitor cause depth-of-focus problems that increase the difficulty of subsequent process integration. Trench capacitors, although more limited in material choices, may be fabricated in more convenient locations on the chip, and provide a planar topography to the chip that does not interfere with subsequent processing.

While trench capacitors are often used in DRAM cells as the storage capacitor that operates with a MOSFET transfer device, they are not altogether suitable for analog applications. More particularly, trench capacitors in DRAM cells are typically operated at 1–2 volts, whereas integrated on-chip capacitors in analog circuits are typically operated at about 8 volts, although operating voltages in excess of 12 volts are not unusual. Moreover, the individual trench capacitors of a DRAM chip are typically about 35 fF, whereas capacitors on a typical analog chip are typically in the hundreds of picofarads capacity. Analog circuits are more sensitive to parasitic capacitances than DRAM circuits, and require capacitors that are more insensitive to applied voltages than trench capacitors in DRAM circuits. There is a need for a trench capacitor useful for analog applications.

BRIEF SUMMARY OF THE INVENTION

In accordance with one aspect of the present invention, a process is provided for forming an isolated thin-film trench capacitor. A first trench is formed in a substrate and filled with an electrically insulating material. A trench capacitor is formed in the first trench by forming first and second pluralities of conductive plates, such as polycrystalline silicon, separated by a layer of dielectric material. The first plurality of conductive plates are electrically connected together and the second plurality of conductive plates are electrically connected together.

In one form of this aspect of the invention, a plurality of second trenches are formed in the electrically insulating material spaced from each other. The first plurality of conductive plates are formed by depositing conductive material onto exposed surfaces of the electrically insulating material to thereby form a continuous first conductive layer in the second trenches and on the exposed surface of the electrically insulating material between the second trenches. The first conductive layer is deposited to a thickness as to only partially fill the second trenches. The layer of dielectric material is formed on the exposed surface of the first conductive layer to a thickness as to only partially fill the second trenches. The second plurality of conductive plates are formed by depositing conductive material onto exposed surfaces of the dielectric layer to thereby form a continuous second conductive layer in the second trenches and on the exposed surface of the electrically insulating material between the second trenches. The second conductive layer is deposited to a thickness as to substantially fill the second trenches.

In another form of this aspect of the invention, a second trench is formed in the electrically insulating material. The trench capacitor is formed by depositing a first layer of conductive material onto exposed surfaces of the electrically insulating material in the second trench. The first layer of conductive material is patterned to expose a portion of the electrically insulating material at the bottom of the second trench adjacent a first side of the second trench, thereby separating the first conductive layer into first and second side portions with the portion at the bottom being electrically connected to the second side portion. A first dielectric layer is formed on the bottom portion of the first conductive layer and the exposed portion of the electrically insulating material. A second layer of conductive material is formed on the first dielectric layer exposed surfaces of the electrically insulating material in the second trench, the second conductive layer electrically engaging the first side portion of the first conductive layer and being spaced from the second side portion of the first conductive layer to expose a portion of the first dielectric layer. A second dielectric layer is formed on the second conductive layer and the exposed portion of the first dielectric layer.

A desirable feature of this aspect of the invention resides in a third layer of conductive material is patterned on the second dielectric layer, the third conductive layer electrically engaging the second side portion of the first conductive layer and being spaced from the first side portion of the first conductive layer to expose a portion of the second dielectric layer. A third dielectric layer is formed on the third conductive layer and the exposed portion of the second dielectric layer. Finally, a fourth layer of conductive material is patterned on the third dielectric layer, the fourth conductive layer electrically engaging the first side portion of the first conductive layer and being spaced from the second side portion of the first conductive layer.

In accordance with another aspect of the present invention, an isolated thin-film trench capacitor comprises a substrate, a first trench in the substrate containing an electrical insulating material and a capacitor imbedded in the electrical insulating material in the trench. The capacitor comprises a plurality of first thin-film electrically conductive plates oriented generally parallel to each other, with each first plate being electrically connected to each other first plate. A plurality of second thin-film electrically conductive plates are oriented generally parallel to each other and to the plurality of first plates, with the second plates being interleaved with the first plates such that opposing surfaces of at least one second plate confronts a surface of each of two first plates and each second plate being electrically connected to each other second plate. A layer of insulating material is sandwiched between the confronting first and second plates such that the layer of insulating material is continuous between each pair of confronting first and second plates.

In one form of this second aspect of the invention, the trench capacitor includes a plurality of second trenches in the electrically insulating material spaced from each other. The plurality of first conductive plates comprises a continuous first conductive layer in the second trenches and on the electrically insulating material between the second trenches and having a thickness as to only partially fill the second trenches. The layer of insulating material has a thickness as to only partially fill the second trenches. The plurality of second conductive plates comprises a continuous second conductive layer in the second trenches and on the layer of electrically insulating material between the second trenches having a thickness as to substantially fill the second trenches.

In another form of this second aspect of the invention, the trench capacitor includes a second trench in the electrically insulating material. First and second side layers of conductive material on the electrically insulating material form sides of the second trench. A bottom layer of conductive material on a bottom of the second trench is electrically isolated from the first side layer of conductive material and electrically connected to the second side layer of conductive material.

A first dielectric layer is on the bottom layer and on the first and second side layers of conductive material. A first intermediate layer of conductive material on the first dielectric layer is electrically connected to the first side layer of conductive material and spaced from the second side layer of conductive material. A second dielectric layer is on the first intermediate conductive layer. A second intermediate layer of conductive material on the second dielectric layer is electrically connected to the second side layer of conductive material and spaced from the first side layer of conductive material. A third dielectric layer is on the second intermediate conductive layer. A top layer of conductive material on the third dielectric layer is electrically connected to the first side layer of conductive material and spaced from the second side layer of conductive material.

In accordance with optional features of both aspects of the invention, the conductive plates may be doped with an electrically activating material, such as boron, phosphorus or arsenic. The doping may be performed by ion implantation, diffusion or in situ incorporation. Additionally, the dielectric layer may be formed by oxidizing an exposed surface of the first conductive plates to form a film of silicon oxide. If desired, a layer of silicon nitride may be deposited onto the silicon oxide film.

DETAILED DESCRIPTION

Figure 1:
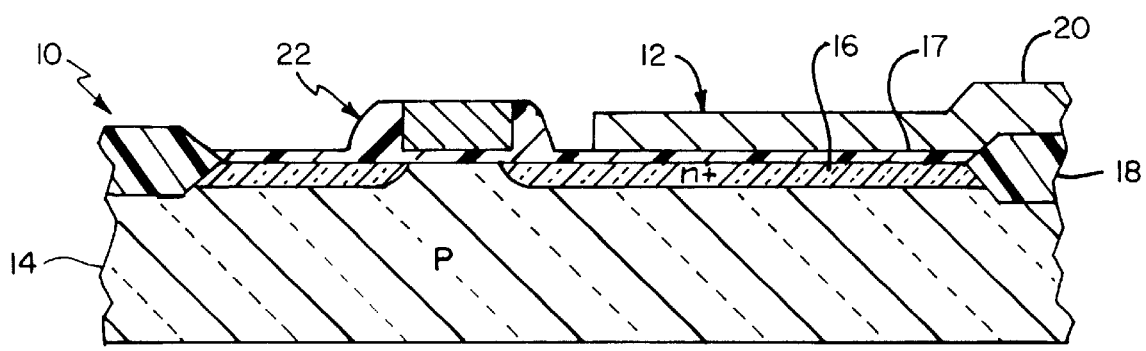
FIG. 1 is a section view of a planar capacitor of the prior art.

FIG. 1 is a section view of a typical planar structure 10 that includes a planar thin-film capacitor 12 formed on a substrate 14, typically formed of semiconductor material, such as p-type semiconductor material. Planar capacitor 12 includes a layer 16 of n-type semiconductor material formed on substrate 14, a layer 17 of suitable dielectric or insulation material, such as silicon dioxide ($SiO_2$), formed on layer 16 and the exposed portion of substrate 14, a second layer 18 of dielectric or insulation material, and a top conductive layer 20, which may be formed of a suitable polycrystalline silicon. In the environment of a DRAM cell, the elements shown generally at 22 in FIG. 1 form parts of a suitable MOSFET. The MOSFET includes portions of n-type semiconductor material, insulation and polycrystalline silicon, and may be formed at the same time as layers 16, 17 and 20 of capacitor 12. Like capacitor 12, MOSFET 22 is formed on the p-type substrate, which forms part of the FET. N-type layer 16 forms a storage electrode for capacitor 12, and polycrystalline silicon layer 20 forms a common plate for the capacitor.

Because capacitor 12 is planar, it requires a considerable amount of real estate on the surface of the chip, thereby limiting the amount of elements available for a given chip area. Moreover, the presence of planar capacitors interferes with the layout of silicon devices on the chip. While increased capacitive density of integrated planar capacitors can be achieved by reduction of dielectric thickness and use of materials with high dielectric constants, film thickness and material selection are limited in some chips, particularly, involving CMOS technology. As a result of the shortcomings of planar capacitors, such as illustrated in FIG. 1, technology has been directed toward stack capacitors of FIGS. 2 and 3 and trench capacitors of FIG. 4.

Figure 2:
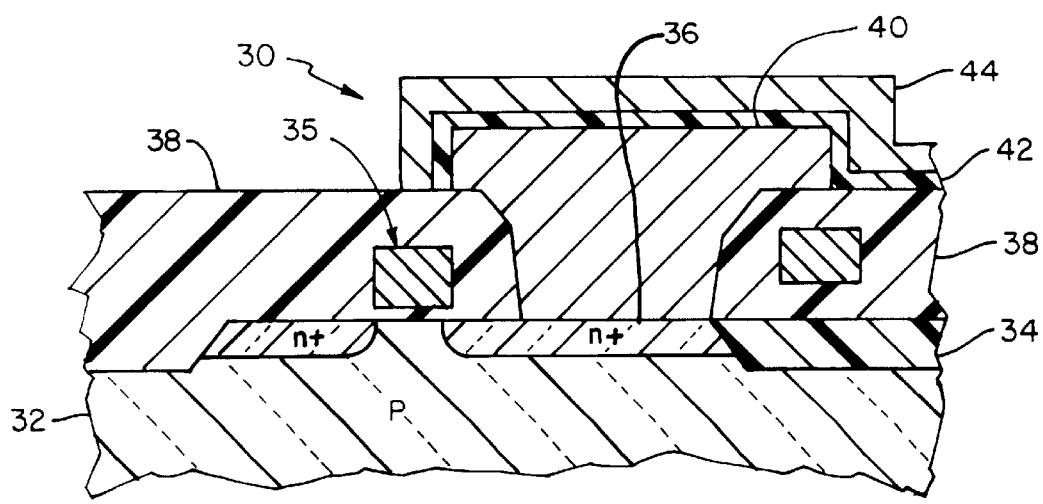
FIG. 2 is a section view of one type of stack capacitor of the prior art.

FIG. 2 illustrates an integrated stack capacitor typically used in DRAM chips. Capacitor 30 is formed on substrate 32 of p-type semiconductor material. A layer 34 of dielectric material, such as $SiO_2$, is formed on a surface of substrate 32, and layer 36 of n-type semiconductor material is formed on the surface of substrate 32. A layer 38 of dielectric material is formed over exposed portions of substrate 32 and layers 34 and 36. Typically, a mask is employed to form a raised conductive polycrystalline silicon plate 40 that extends above the upper surface of layer 38 and is in contact with embedded n-type semiconductive layer 36. Dielectric layer 42, such as $SiO_2$, is formed over plate 40 and in contact with layer 38 as to isolate plate 40 from polycrystalline silicon layer 44 over layer 42. Layer 44 defines the common plate of capacitor 30 and plate 40 forms the embedded plate, in contact with the MOSFET shown generally at 35 through layer 36.

Figure 3:
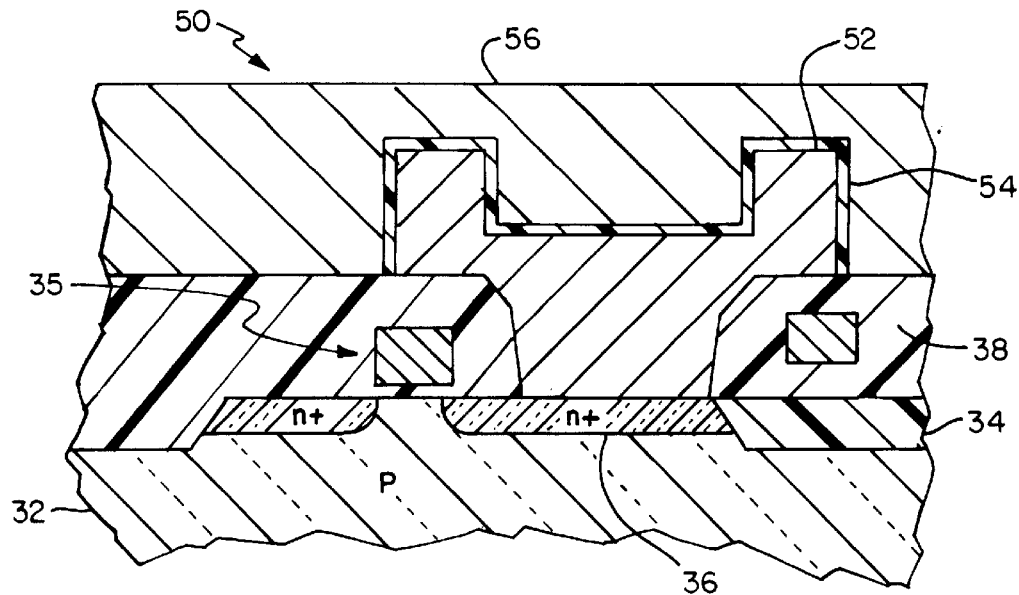
FIG. 3 is a section view of another type of a stack capacitor of the prior art, known as a crown capacitor.

FIG. 3 illustrates another typical stack capacitor 50 known as a crown capacitor. Capacitor 50 is similar to capacitor 30 illustrated in FIG. 2, except that polycrystalline silicon plate 52 includes upright portions in the shape of a crown, instead of a flat plate like plate 40 in FIG. 2. Dielectric layer 54, such as $SiO_2$, is formed over plate 52, and polycrystalline silicon layer 56 is formed over and encapsulates dielectric layer 54 to form capacitor 50. The advantage of capacitor 50 is that there is increased surface area of the capacitive plates across the dielectric.

The principal advantage of a stack capacitor such as illustrated in FIGS. 2 and 3 over a planar capacitor of FIG. 1 is that the capacitor size can be increased without significantly increasing the requirement for chip real estate. Moreover, by being fabricated near the end of the processing of the chip, a greater selection of materials for the capacitor is available, because fewer processing steps subsequent to the deposit of the material are likely to affect the material. However, the presence of stack capacitors make the layout of other circuit elements on the chip inconvenient, and interfere with metal interconnections of other circuit elements. For these reasons, trench capacitors, such as illustrated in FIG. 4, have been employed in DRAM cells.

Figure 4:
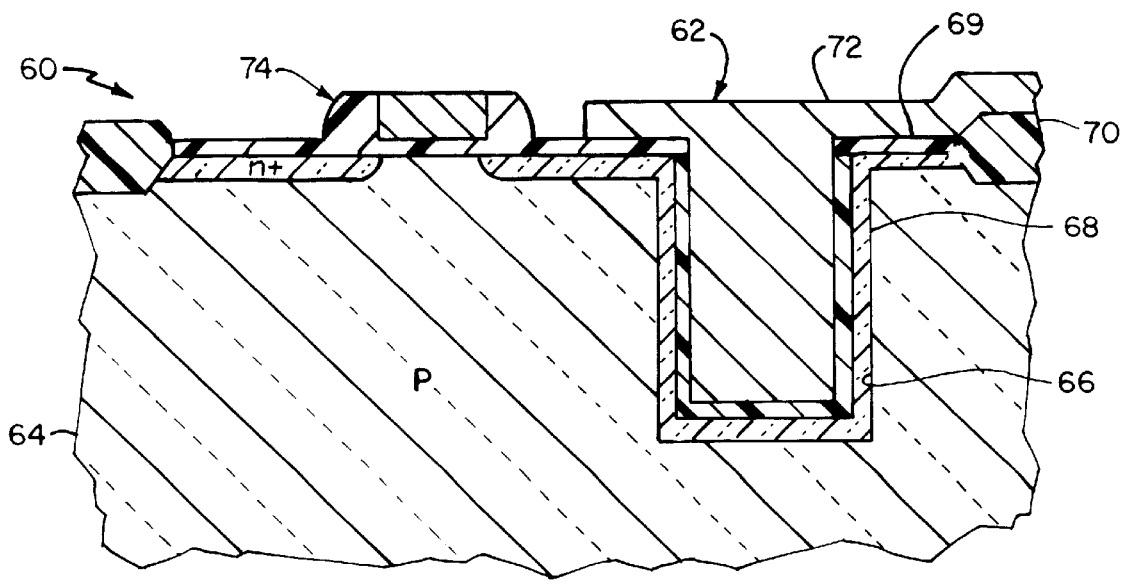
FIG. 4 is a section view of a trench capacitor of the prior art.

Chip 60 illustrated in FIG. 4 includes a trench capacitor 62 formed in substrate 64, such as formed of p-type semiconductor material. More particularly, a trench 66 is formed in the p-type material and a layer 68 of n-type semiconductor material is formed into portions of the chip, including within trench 66. A layer 69 of dielectric material, such as $SiO_2$, is formed over layer 68 of n-type material, including within trench 66, a layer 70 of dielectric material is formed on substrate 64 contiguous layer 69, and a layer 72 of polycrystalline silicon is deposited over layers 69 and 70, filling trench 66. MOSFET 74 is then completed. Again, layer 68 forms an embedded conductive plate and layer 72 forms the common plate to the capacitor. The trench capacitor of FIG. 4 offers several advantages over planar and stack capacitors in that the trench capacitor does not significantly interfere with device or circuit layout on the chip.

Trench capacitors, such as illustrated in FIG. 4, use three-dimensional topography to increase the capacitive surface area, thereby increasing the capacitance density per unit area of chip real estate. However, prior trench capacitors, such as illustrated in FIG. 4, have employed lower or embedded plates, such as plate 68, formed of semiconductive material that is in direct contact with the semiconductor material of the other elements of the chip. While this provides a convenient connection of the capacitor to the MOSFET in a DRAM cell, it also increases the likelihood of stray capacitance conditions. While this has not been a significant problem in DRAM cells, largely due to insensitivity of digital circuits to such parasitic capacitances, the technology creates difficulties in integrated analog circuits.

Figure 5:
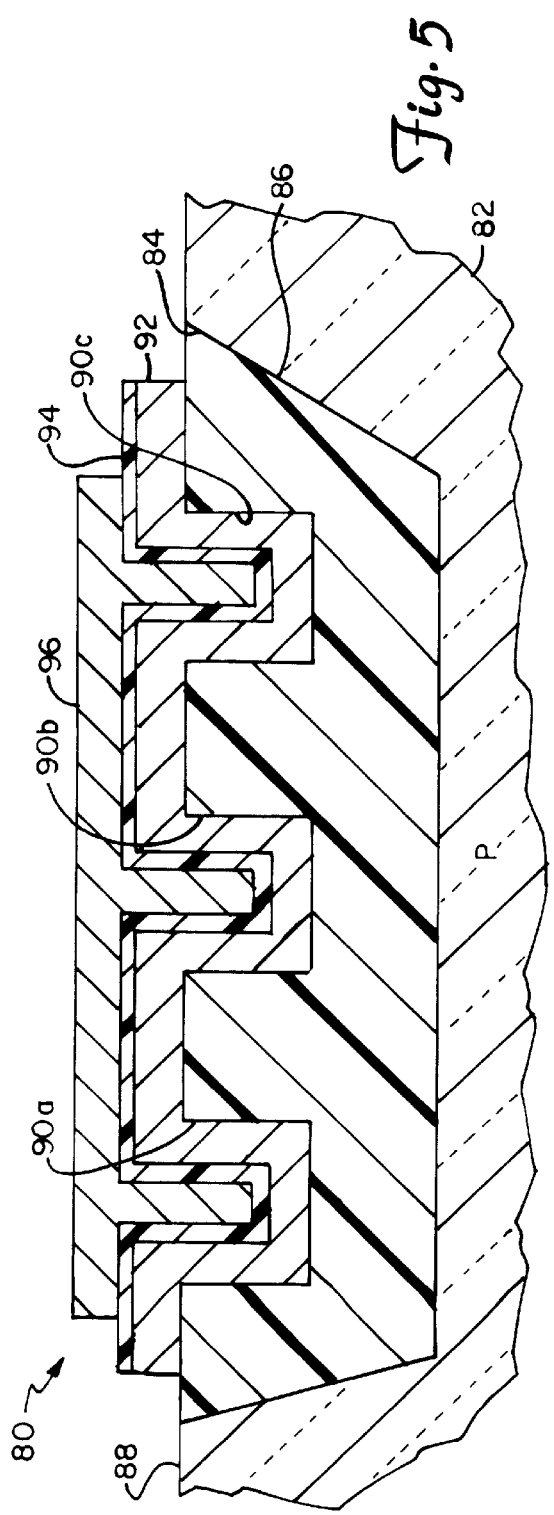
FIG. 5 is a section view of an isolated trench capacitor according to one embodiment of the present invention.

FIG. 5 illustrates a trench capacitor in accordance with the first embodiment of the first invention in which substrate 82, which may be formed of a suitable p-type semiconductor material, includes a deep trench 84. A layer of dielectric material, such as silicon dioxide ($SiO_2$), is deposited into trench 84 and the upper surface thereof is made planar to the surface 88 of the substrate. The exposed surface of layer 86 is then masked and patterned to permit etching or removal of a portion of the material layer 86 to thereby form trenches 90a, 90b, 90c, etc. in layer 86. A conductive layer 92, such as polycrystalline silicon, amorphous silicon, crystalline silicon, SiC, TiN or other suitable conductive, is formed over the surface 88 of layer 86, and within trenches 90. The thickness of layer 92 is such that it does not fill trenches 90. If layer 92 is formed of polycrystalline silicon, the electrical conductivity of the polycrystalline silicon is increased by doping it with electrically activating atomic species, such as boron, phosphorous or arsenic. Doping can be accomplished by ion implantation, diffusion, or in situ incorporation during deposition of the polycrystalline silicon. Next, the capacitive dielectric layer 94 is deposited onto or grown out of lower conductive layer 92. Preferably, the dielectric layer includes a silicon dioxide film grown out of the polycrystalline silicon layer 92 by an oxidizing technique. Also preferably, a silicon nitride film is deposited at a low pressure chemical vapor deposition onto the silicon dioxide, thereby forming dielectric layer 94. Optionally, an additional silicon dioxide layer (not shown) may be formed on the silicon nitride film by deposition.

Next, the upper plate 96 of polycrystalline silicon is deposited onto exposed surfaces of insulating layer 94 to fill trenches 90. Subsequently, layer 96 is patterned and etched, and layers 92 and 94 are patterned and etched.

One feature of the trench capacitor illustrated in FIG. 5 is that the dielectric layer 86 effectively isolates the capacitor from the remainder of the circuit, thereby reducing the effects of stray capacitance. This is particularly advantageous in integrated analog integrated circuits.

Figure 6:
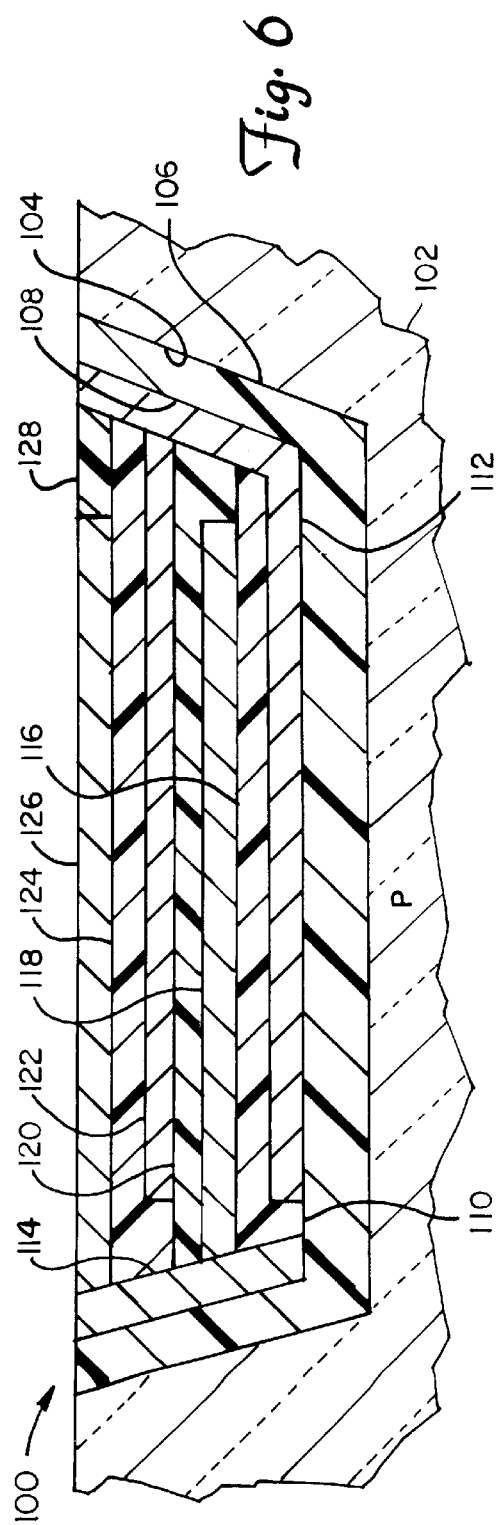
FIG. 6 is a section view of an isolated trench capacitor according to a second embodiment of the present invention.

FIG. 6 illustrates another embodiment of the present invention in which trench capacitor 100 is formed in p-type semiconductor substrate 102. More particularly, a trench 104 is formed in substrate 102 and filled with dielectric material 106, such as $SiO_2$. A single trench 108 is formed in layer 106 and a conductive layer, such as polycrystalline silicon, is formed on the exposed surfaces of trench 108. Initially, the layer of polycrystalline silicon extends down both sides of the trench as well as along the bottom, but is etched away at one side at 110 to separate the initial layer into a first layer 112 that extends down one side of the trench and across the bottom, and a second side 114 down the opposite side of the trench. A layer 116 of dielectric material, such as $SiO_2$, is formed onto the exposed surface of the bottom layer 112 of polycrystalline silicon, and in the region 110 between plate 112 and plate 114. Polycrystalline silicon layer 118 is deposited and patterned onto the exposed surface of dielectric layer 116 as to electrically connect to layer 114 but not to layer 112. A layer 120 of dielectric material is formed onto the exposed surface of layer 118 and layer 116, and layer 122 of polycrystalline silicon is patterned and etched on the exposed surface of layer 120 to electrically connect to layer 112 but not to layer 114. Subsequently, a layer 124 of dielectric layer is formed on the exposed surfaces of layers 120 and 122, and a layer 126 of polycrystalline silicon is patterned and etched on the exposed surface of layer 124 to electrically connect to layer 114 but not to layer 112. Finally, a layer 128 of dielectric material is formed in the void between layers 126 and 112. Capacitor 100 may include any number of interleaved layers of conductive layers, such as polycrystalline silicon, separated by dielectric layers and the four conductive layers of polycrystalline silicon is given by way of example and not of limitation. Thus, additional conductive layers and dielectric may be added with the conductive layers being connected alternately to side layers 112 and 114. Additionally, the conductive layers are preferably formed of polycrystalline silicon, although other conductive materials may be used.

If the conductive layers 112, 114, 118, 122 and 126 are formed of polycrystalline silicon, the material is doped with an electrically activating atomic species, such as boron, phosphorous, or arsenic, by ion implantation, diffusion or in situ incorporation during the deposition of the polycrystalline silicon. Dielectric layers 110, 116, 120, 124 and 128 may be formed by oxidation of the silicon of the lower layers to form silicon dioxide layers, but care must be taken to ensure that portions of layers 114 and the side portion of layer 112 are not oxidized as to insulate layers 118, 122, and 126 from the respective side connections. Alternatively, silicon nitride and/or silicon dioxide may be deposited into the trench to form layers 110, 116, 120, 124 and 128.

The embodiments illustrated in FIGS. 5 and 6 provide effective isolation of the capacitor from other portions of the chip and of the circuit, and offer the traditional advantages of trench capacitors in that they may be positioned at virtually any convenient location on the chip. The embodiment of FIG. 5 is in the form of a dual trench capacitor employing a single trench to isolate the plural trench capacitor from the substrate and the rest of the remainder of the circuit. The embodiment of FIG. 6 places the plates in a substantially horizontal interleaved configuration, but requires different processing and additional mask steps over that of FIG. 5.

Although the present invention has been described with reference to preferred embodiments, workers skilled in the art will recognize that changes may be made in form and detail without departing from the spirit and scope of the invention.

What is claimed is:

1. An isolated thin-film trench capacitor comprising:
   a substrate,
   a first trench in the substrate containing an electrically insulating material,
   a capacitor imbedded in the electrically insulating material in the first trench, the capacitor comprising:
      a plurality of second trenches in the electrically insulating material, the second trenches being spaced from each other,
      a continuous first conductive layer in the second trenches and on the electrically insulating material between the second trenches, the first conductive layer having a thickness as to only partially fill the second trenches,
      a dielectric layer oil the first conductive layer, the dielectric layer having a thickness as to only partially fill the second trenches, and
      a continuous second conductive layer in the second trenches and on the dielectric layer, the second conductive layer having a thickness as to substantially fill the second trenches.

2. The trench capacitor of claim 1, wherein the first and second conductive layers are formed of polycrystalline silicon doped with an electrically activating material selected from the group consisting of boron, phosphorus and arsenic.

3. The trench capacitor of claim 1, wherein the layer of insulating material comprises a silicon oxide film.

4. The trench capacitor of claim 3, including a layer of silicon nitride on the silicon oxide film.

5. An isolated thin-film trench capacitor comprising:
   a substrate,
   a first trench in the substrate containing, an electrically insulating material,
   a capacitor imbedded in the electrically insulating material in the first trench, the capacitor comprising:
      a second trench in the electrically insulating material, first and second side layers of conductive material on the electrically insulating material forming sides of the second trench,
      a bottom layer of conductive material on a bottom of the second trench, the bottom layer of conductive material being electrically isolated from the first side layer of conductive material and being electrically connected to the second side layer of conductive material,
      a first dielectric layer on the bottom layer and on the first and second side layers of conductive material,
      a first intermediate layer of conductive material on the first dielectric layer and electrically connected to the first side layer of conductive material, the first intermediate layer of conductive material being spaced from the second side layer of conductive material, and
      a second dielectric layer on the first intermediate conductive layer.

6. The trench capacitor of claim 5, further including
   a second intermediate layer of conductive material on the second dielectric layer and electrically connected to the second side layer of conductive material, the second intermediate layer of conductive material being spaced from the first side layer of conductive material,
   a third dielectric layer on the second intermediate conductive layer, and
   a top layer of conductive material on the third dielectric layer and electrically connected to the first side layer of conductive material, the top layer of conductive material being spaced from the second side layer of conductive material.

7. The trench capacitor of claim 6, wherein the bottom, first intermediate, second intermediate and top layers are formed of polycrystalline silicon doped with an electrically activating material selected from the group consisting of boron, phosphorus and arsenic.

8. The trench capacitor of claim 6, wherein the first, second and third dielectric layers comprise silicon oxide films, and a layer of silicon nitride on the silicon oxide films.

* * * * *

UNITED STATES PATENT AND TRADEMARK OFFICE
CERTIFICATE OF CORRECTION

PATENT NO. : 6,259,149 B1 Page 1 of 1
DATED : July 10, 2001
INVENTOR(S) : Joseph J. Burkhardt et al.

It is certified that error appears in the above-identified patent and that said Letters Patent is hereby corrected as shown below:

<u>Column 8,</u>
Line 1, delete "oil", insert -- on --

Signed and Sealed this

Eleventh Day of June, 2002

Attest:

JAMES E. ROGAN
Attesting Officer           Director of the United States Patent and Trademark Office